United States Patent [19]

Tsukamoto et al.

[11] Patent Number: 5,684,400

[45] Date of Patent: Nov. 4, 1997

[54] DIFFUSION SENSITIZING IMAGING METHOD, DYNAMIC IMAGING METHOD, AND MRI APPARATUS

[75] Inventors: Tetsuji Tsukamoto; Eiji Yoshitome, both of Tokyo, Japan

[73] Assignee: GE Yokogawa Medical Systems, Limited, Tokyo, Japan

[21] Appl. No.: 631,596

[22] Filed: Apr. 15, 1996

[30] Foreign Application Priority Data

Jun. 12, 1995 [JP] Japan ................................. 7-143784
Feb. 15, 1996 [JP] Japan ................................. 8-28225

[51] Int. Cl.$^6$ ..................................................... G01V 3/00
[52] U.S. Cl. ......................................... 324/309; 324/307
[58] Field of Search ............................. 324/307, 309, 324/300, 314; 128/653.2

[56] References Cited

U.S. PATENT DOCUMENTS

| | | | |
|---|---|---|---|
| 5,016,637 | 5/1991 | Koizumi et al. | 128/653 |
| 5,089,784 | 2/1992 | Yoshitome et al. | 324/309 |
| 5,162,736 | 11/1992 | Mansfield et al. | 324/309 |
| 5,227,724 | 7/1993 | Cory et al. | 324/307 |
| 5,235,279 | 8/1993 | Kaufman et al. | 324/309 |
| 5,247,935 | 9/1993 | Cline et al. | 128/653.2 |
| 5,307,812 | 5/1994 | Hardy et al. | 128/653.2 |
| 5,317,262 | 5/1994 | Moonen et al. | 324/309 |
| 5,363,042 | 11/1994 | Dumoulin | 324/306 |
| 5,488,297 | 1/1996 | Nakada | 324/309 |
| 5,539,310 | 7/1996 | Basser et al. | 324/309 |
| 5,560,360 | 10/1996 | Filler et al. | 324/307 |

OTHER PUBLICATIONS

Magnetic Resonance in Medicine, vol. 19, 1991, pp. 247–253 R. Turner et al "Echo–lanar Imaging of Diffusion and Perfusion".

Society of Magnetic Resonance in Medicien, 7th Ann Meet, Works in Progress, 1988, San Francisco, p. 123, K. Sano et al "Mr Angiography using short echo time sequence with Asymmetric measurement data".

Interleaved echo Planar Imaging on a standard MRI system. Kim Butts, et al, MRM 31/67–72(1994), pp. 67–72.

Astract "Local Look (LOLO): Zoom Fluoroscopy of a Moving Target" J.J. Van vaals, et al, p. 38, JMRI 1994.

Zonally Magnified EPI in real time by NMR, P. Mansfield et al. J.Phsy. E.Sci, Inst. 21 (1988), pp.27–280, IOP Publishing Ltd.

*Primary Examiner*—Louis M. Arana
*Attorney, Agent, or Firm*—Moonray Kojima

[57] ABSTRACT

An MRI apparatus applies an exciting pulse R1 and a slicing gradient S1 which excites a slice S. Subsequently, it applies a diffusion sensitizing gradient MPG1. Next, it applies a reversing pulse R2 and an FOV limiting gradient RS which limits the data collecting region to have a narrow FOV. Next, it applies a diffusion sensitizing gradient MPG2. Next, it applies a positive and negative reading gradients RA and RB m times alternately and cyclically, and collects MR data from the multiple imaged echoes el–em, while applying phase encoding gradients W. The phase encoding gradient W has its amplitude-time product set to be $1/(\gamma \cdot FOV)$, where $\gamma$ is the magnetogyric ratio. The apparatus produces a diffusion sensitized image at a practical spatial resolution, with artifacts attributable to the body movement being alleviated in exchange for a narrow FOV in the phase encoding axis direction.

10 Claims, 17 Drawing Sheets

DIFFUSION SENSITIZING IMAGING METHOD, DYNAMIC IMAGING METHOD, AND MRI APPARATUS

BACKGROUND OF THE INVENTION

The present invention relates to a diffusion sensitizing imaging method, dynamic imaging method, and magnetic resonance imaging (MRI) apparatus. More particularly, the invention relates to a diffusion sensitizing imaging method capable of reducing artifacts attributable to the patient's involuntary body movement, and to a dynamic imaging method capable of producing images of different time-phases at a higher spatial resolution and time resolution, and to an MRI apparatus capable of carrying out these methods.

FIG. 18 is a flowchart showing an example of the diffusion sensitizing imaging process implemented by a conventional MRI apparatus.

In step V1, the operator specifies a slice. Specifically, the operator enters the position and width of an intended exciting region S in the slicing axis direction Ds. As shown in FIG. 19, the lateral direction and longitudinal direction are set to be the reading axis direction Dr and phase encoding axis direction Dp, respectively.

In step V3, the operator specifies a field of view (FOV) in the phase encoding axis direction Dp and a number of times m of phase encoding of a diffusion sensitized image. For example, the FOV is set to be 240 mm, and the m is set to be 256. In this example, the spatial resolution $\beta$ in the phase encoding axis direction Dp of the diffusion sensitized image G is evaluated to be about 0.94 mm (240/256) based on the relation of FOV=$\beta$·m shown in FIG. 20.

Returning to FIG. 18, the process of step V40 creates a pulse sequence B of the spin-echo method, with the intra voxel incoherent motion (IVIM) method being applied.

FIG. 21 shows the pulse sequence B of the spin-echo method.

In this pulse sequence B, an exciting pulse R1, a slicing gradient S1 for the excitation of the slice S and a phase encoding gradient PH are applied. Subsequently, a diffusion sensitizing gradient MPG1 is applied. Next, a reversing pulse R2 and slicing gradient S2 are applied. Next, a diffusion sensitizing gradient MPG2 is applied. Next, a reading gradient RD is applied and, at the same time, magnetic resonance (MR) data is collected. The diffusion sensitizing gradients MPG1 and MPG2 can be applied along arbitrary gradient axes, and these are shown separately as motion probing (MP) in FIG. 21.

The pulse sequence of the spin-echo method with the application of the IVIM method is disclosed in Japanese patent application No. Hei6-121781, for example.

Returning to FIG. 18, the process of steps V50, V55 and V56 repeats the pulse sequence B for the number of times m of phase encoding, while altering the phase encoding gradient PH, thereby to collect MR data d1, d2, ..., dm which fill the k-space KS as shown in FIG. 22.

The process of step V6 renders the two-dimensional Fourier transformation for the MR data d1, d2, ..., dm in the k-space KS, thereby producing a diffusion sensitized image G as shown in FIG. 23. Step V7 displays the resulting sensitized image G.

In the dynamic imaging process of the conventional MRI apparatus, in which case contrast medium is injected into the body under test, MR data is collected by using a pulse sequence B', which is the pulse sequence B of FIG. 21 for MPG1=0 and MPG2=0, repeatedly for different time-phases, and images of different time-phases of the same data collecting region are obtained. This conventional diffusion sensitizing imaging method necessitates the repetition of the pulse sequence B for the number of times m of phase encoding, and it takes about 4 minutes in the case of m=256.

However, diffusion sensitizing imaging is extremely vulnerable to the patient's involuntary body movement (e.g., breathing), which will be inevitable during such a long image pickup time as 4 minutes, and motion artifacts will emerge.

Moreover, the conventional diffusion sensitizing imaging method, which takes a time interval of about 4 minutes in picking up images of different time-phases, suffers a low time resolution.

SUMMARY OF THE INVENTION

A first object of the present invention is to provide a diffusion sensitizing imaging method and MRI apparatus capable of alleviating artifacts attributable to the patient's involuntary body movement.

A second object of the invention is to provide a dynamic imaging method and MRI apparatus capable of producing images at a high time resolution.

On a first viewpoint, the present invention resides in a diffusion sensitizing imaging method which applies a slicing gradient which limits the exciting region in the slicing axis direction together with an exciting pulse, applies a diffusion sensitizing gradient, applies an FOV limiting gradient which limits the data collecting region in the phase encoding axis direction together with a reversing pulse, applies a diffusion sensitizing gradient, reverses the gradient magnetic field continuously to image multiple echoes and collects MR data from the resulting echoes, and produces a diffusion sensitized image of the data collecting region from the collected MR data.

On a second viewpoint, the present invention resides in a diffusion sensitizing imaging method which applies a slicing gradient which limits the exciting region in the slicing axis direction together with an exciting pulse, applies a diffusion sensitizing gradient, applies an FOV limiting gradient which limits the data collecting region in the phase encoding axis direction together with a reversing pulse, applies a diffusion sensitizing gradient, reverses the gradient magnetic field continuously to image multiple echoes and collects MR data from the resulting echoes, and produces a diffusion sensitized image of the data collecting region from the collected MR data, with the timing of application of the reversing pulse and gradient magnetic field being adjusted such that the spin echo center precedes the k-space center so that the resulting time interval from the application of the reversing pulse to the commencement of application of the gradient magnetic field is longer than the case of a coincident spin echo center and k-space center, thereby extending the duration of the diffusion sensitizing gradients accordingly.

On a third viewpoint, the present invention resides in a dynamic imaging method which applies a slicing gradient which limits the exciting region in the slicing axis direction together with an exciting pulse, applies an FOV limiting gradient which limits the data collecting region in the phase encoding axis direction together with a reversing pulse, and reverses the gradient magnetic field continuously to image multiple echoes and collects MR data from the resulting echoes, with these operations being repeated for different time-phases thereby to produce images of the different time-phases of the data collecting region from the MR data of the time-phases.

On a fourth viewpoint, the present invention resides in an MRI apparatus comprising data collecting means which applies a slicing gradient which limits the exciting region in the slicing axis direction together with an exciting pulse, applies a diffusion sensitizing gradient, applies an FOV limiting gradient which limits the data collecting region in the phase encoding axis direction together with a reversing pulse, applies a diffusion sensitizing gradient, and reverses the gradient magnetic field continuously to image multiple echoes and collects MR data from the resulting echoes, image forming means which produces a diffusion sensitized image from the MR data, and image display means which displays the produced diffusion sensitized image.

On a fifth viewpoint, the present invention resides in an MRI apparatus comprising data collecting means which applies a slicing gradient which limits the exciting region in the slicing axis direction together with an exciting pulse, applies a diffusion sensitizing gradient, applies an FOV limiting gradient which limits the data collecting region in the phase encoding axis direction together with a reversing pulse, applies a diffusion sensitizing gradient, and reverses the gradient magnetic field continuously to image multiple echoes and collects MR data from the resulting echoes, with the timing of application of the reversing pulse and gradient magnetic field being adjusted such that the spin echo center precedes the k-space center so that the resulting time interval from the application of the reversing pulse to the commencement of application of the gradient magnetic field is longer than the case of a coincident spin echo center and k-space center, thereby extending the duration of the diffusion sensitizing gradients accordingly, image forming means which produces a diffusion sensitized image from the MR data, and image display means which displays the produced diffusion sensitized image.

On a sixth viewpoint, the present invention is derived from the MRI apparatus of the foregoing arrangement, wherein the data collecting means implements the MR data collection a multiple number of times, while moving the data collecting region in the phase encoding axis direction, and the image display means displays a diffusion sensitized image having an enlarged FOV resulting from the composition of the produced multiple diffusion sensitized images.

On a seventh viewpoint, the present invention is derived from the MRI apparatus of the foregoing arrangement, wherein the data collecting means implements the MR data collection a multiple number of times for a fixed data collecting region, while altering the diffusion sensitizing gradients, and the image display means displays the produced multiple diffusion sensitized images.

On an eighth viewpoint, the present invention resides in an MRI apparatus comprising data collecting means which applies a slicing gradient which limits the exciting region in the slicing axis direction together with an exciting pulse, applies an FOV limiting gradient which limits the data collecting region in the phase encoding axis direction together with a reversing pulse, and reverses the gradient magnetic field continuously to image multiple echoes and collects MR data from the resulting echoes, with these operations being repeated for different time-phases, image forming means which produces images of different time-phases for the same data collecting region from the MR data of the time-phases, and image display means which displays the images of the different time-phases.

The diffusion sensitizing imaging method of the first viewpoint applies a slicing gradient which limits the exciting region in the slicing axis direction together with an exciting pulse, next applies a diffusion sensitizing gradient, next applies an FOV limiting gradient which limits the data collecting region in the phase encoding axis direction together with a reversing pulse, next applies a diffusion sensitizing gradient, next reverses the gradient magnetic field continuously to image multiple echoes and collects MR data from the resulting echoes, and produces a diffusion sensitized image of the data collecting region from the MR data.

Since this method produces an diffusion sensitized image from MR data collected by a single excitation (single shot), the image pickup time can be reduced to several seconds and, consequently, motion artifacts can be alleviated. On the other hand, the number of echoes for collecting MR data effectively by a single excitation is limited (several tens echoes) and the spatial resolution would be deteriorated significantly if the same FOV in the phase encoding axis direction as the conventional one is intended. However, the FOV in the phase encoding axis direction is narrowed by the application of the FOV limiting gradient, and the spatial resolution does not fall. Accordingly, this method produces a diffusion sensitized image without motion artifacts at a practical resolution in exchange for a narrow FOV in the phase encoding axis direction.

The diffusion sensitizing imaging method of the second viewpoint also has a narrow FOV in the phase encoding axis direction as in the method of the first viewpoint, but it produces a diffusion sensitized image without motion artifacts at a practical resolution. Furthermore, this method can have an extend duration of the diffusion sensitizing gradients as compared with the case of a coincident spin echo center (the time point at which the signal intensity of spin echo is maximum) and k-space center (the time point of collecting MR data of "0" phase encoding value). The longer the duration of the diffusion sensitizing gradient, the higher is the degree of diffusion sensitization, and therefore a diffusion image having higher diffusion sensitization than the case of a coincident spin echo center and k-space center can be obtained. Although the image quantity can be slightly degraded theoretically due to the different timing of the spin echo center and k-space center, it does not impose a practical problem.

The diffusion sensitizing imaging method of the third viewpoint applies a slicing gradient which limits the exciting region in the slicing axis direction together with an exciting pulse, next applies an FOV limiting gradient which limits the data collecting region in the phase encoding axis direction together with a reversing pulse, next reverses the gradient magnetic field continuously to image multiple echoes and collects MR data from the resulting echoes, with these operations being repeated for different time-phases thereby to produce images of the different time-phases for the data collecting region from the MR data of the time-phases, and displays an array of the produced images of the different time-phases on the screen.

Since this method produces a diffusion sensitized image from MR data collected by a single shot, the image pickup time can be reduced to several seconds and the time interval of images of different time-phases can be reduced, and it enables the dynamic imaging at a high time resolution. On the other hand, the number of echoes for collecting MR data effectively by a single excitation is limited (several tens echoes) and the spatial resolution would be deteriorated significantly if the same FOV in the phase encoding axis direction as the conventional one is intended. However, the FOV in the phase encoding axis direction is narrowed by the application of the FOV limiting gradient, and the spatial resolution does not fall. Accordingly, this method produces diffusion sensitized images at a practical resolution in exchange for a narrow FOV in the phase encoding axis direction. The method enables the display of arrayed images on the screen, making the observation of time-to-time image changes very easy.

The MRI apparatus of the fourth viewpoint accomplishes the diffusion sensitizing imaging method of the first viewpoint properly. It produces a diffusion sensitized image without motion artifacts at a practical resolution in exchange for a narrow FOV in the phase encoding axis direction.

The MRI apparatus of the fifth viewpoint accomplishes the diffusion sensitizing imaging method of the second viewpoint properly. It produces a diffusion sensitized image without motion artifacts at a practical resolution in exchange for a narrow FOV in the phase encoding axis direction. Furthermore, the apparatus is capable of producing a diffusion image having higher diffusion sensitization than the case of a coincident spin echo center and k-space center.

The MRI apparatus of the sixth viewpoint implements the foregoing diffusion sensitizing imaging method a multiple number of times, while moving the data collecting region in the phase encoding axis direction, and produces a diffusion sensitized image having an enlarged FOV by composing the resulting multiple diffusion sensitized images. The diffusion sensitized image having an enlarged FOV has a practical resolution without motion artifacts, because of its crude diffusion sensitized images having the same properties. Accordingly, the apparatus is capable of producing a diffusion sensitized image without motion artifacts at a practical resolution, while having an FOV as large as the conventional one.

The MRI apparatus of the seventh viewpoint implements the foregoing diffusion sensitizing imaging method a multiple number of times for a fixed data collecting region, while altering the diffusion sensitizing gradients, and displays an array of the produced diffusion sensitized images on the screen. Accordingly, the apparatus continuously produces diffusion sensitized images without motion artifacts at a practical resolution in exchange for a narrow FOV. It allows narrow-FOV images to be displayed by being arrayed on the screen. Furthermore, based on the alteration of diffusion sensitizing gradients, the apparatus enables the inspector to distinguish a true diffusion from an apparent diffusion (e.g., caused by the blood flow in capillaries) by comparing the arrayed diffusion sensitized images.

The MRI apparatus of the eighth viewpoint accomplishes the dynamic imaging method of the third viewpoint properly. The apparatus is capable of carrying out the dynamic imaging at a high time resolution, making the observation of time-to-time image changes very easy owing to arrayed images on the screen in exchange for a narrow FOV.

DESCRIPTION OF THE PREFERRED EMBODIMENTS

Specific embodiments of this invention will be explained in more detail. The scope of the invention is not confined by these embodiments however.

EMBODIMENT 1

Figure 1:
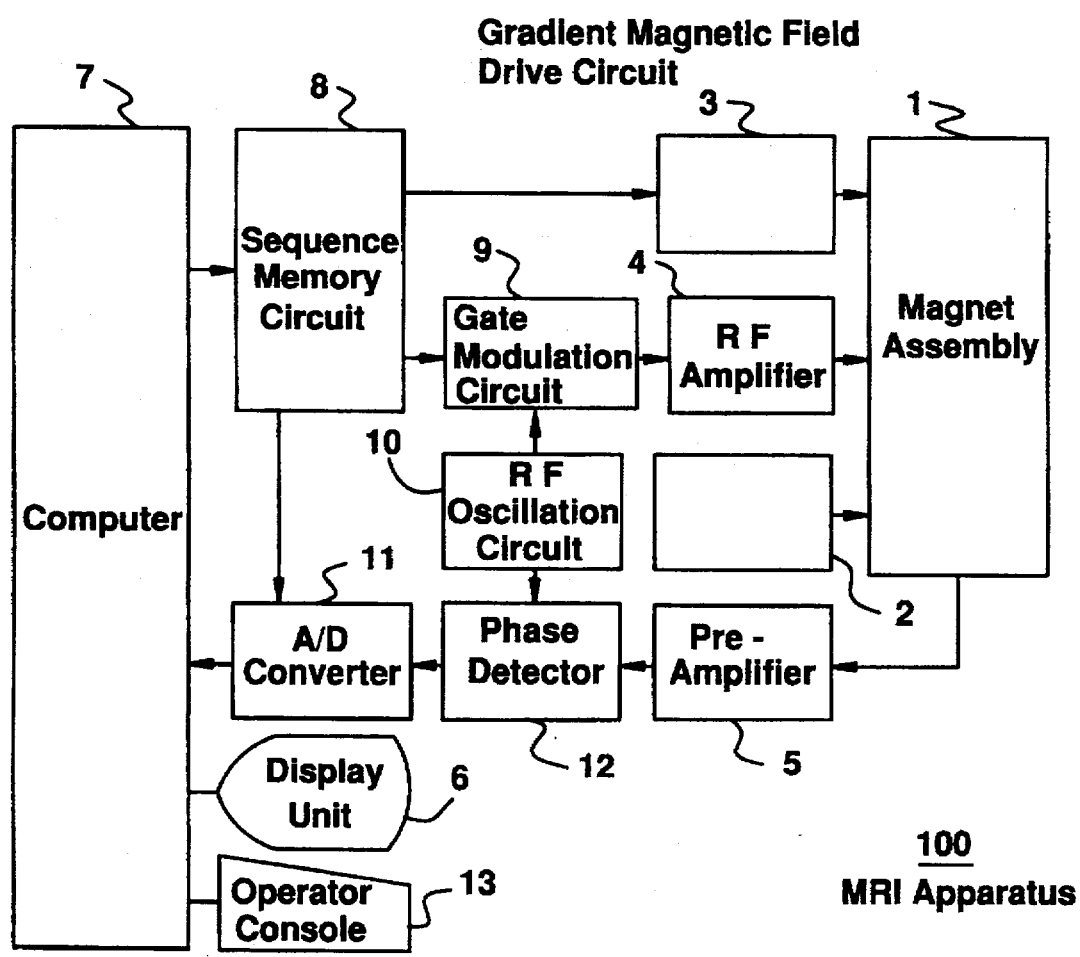
FIG. 1 is a block diagram of the MRI apparatus based on a first embodiment of this invention.

FIG. 1 shows the MRI apparatus of the first embodiment of invention.

In the MRI apparatus 100, a magnet assembly 1 has a bore section in which a body under test is placed. There are disposed to surround the bore section a main magnetic field coil which applies a constant main magnetic field to the body, a set of gradient magnetic field coils which produce a gradient magnetic field (these coils are an x-axis coil, y-axis coil and z-axis coil, and the slicing axis, phase encoding axis and reading axis are determined by the combination of these coils), a transmission coil which emits an RF pulse for inducing the nuclear spin in the body, and a reception coil which receives the NMR signal from the body. The main magnetic field coil, gradient magnetic field coils, transmission coil and reception coil are connected to a main magnetic field power source 2, gradient magnetic field drive circuit 3, RF power amplifier 4 and preamplifier 5, respectively.

A computer 7 creates a pulse sequence and sends it to a sequence memory circuit 8, which stores the pulse sequence. Based on the pulse sequence, the gradient magnetic field drive circuit 3 operates to drive the gradient magnetic field coils of the magnet assembly 1 so that the coils produce a gradient magnetic field, and a gate modulation circuit 9 operates to modulate the carrier signal produced by an RF oscillation circuit 10 into a pulsative signal having a prescribed timing and prescribed envelope and deliver the resulting RF pulse to the RF power amplifier 4. The RF pulse amplified by the RF power amplifier 4 is applied to the transmission coil of the magnet assembly 1.

The pre-amplifier 5 amplifies the NMR signal received by the reception coil of the magnet assembly 1 and delivers the amplified signal to a phase detector 12. The phase detector 12 implements the phase detection for the NMR signal by using the carrier signal from the RF oscillation circuit 10 as a reference signal and delivers the phase-detected signal to an A/D converter 11. The A/D converter 11 converts the analog NMR signal into a digital MR data and delivers the data to the computer 7.

The computer 7 reads the MR data from the A/D converter 11 and implements the image rearrangement process thereby to create an image. The resulting image is displayed by a display unit 6.

The computer 7 governs the whole system, inclusive of the transaction of information with an operator console 13.

Figure 2:
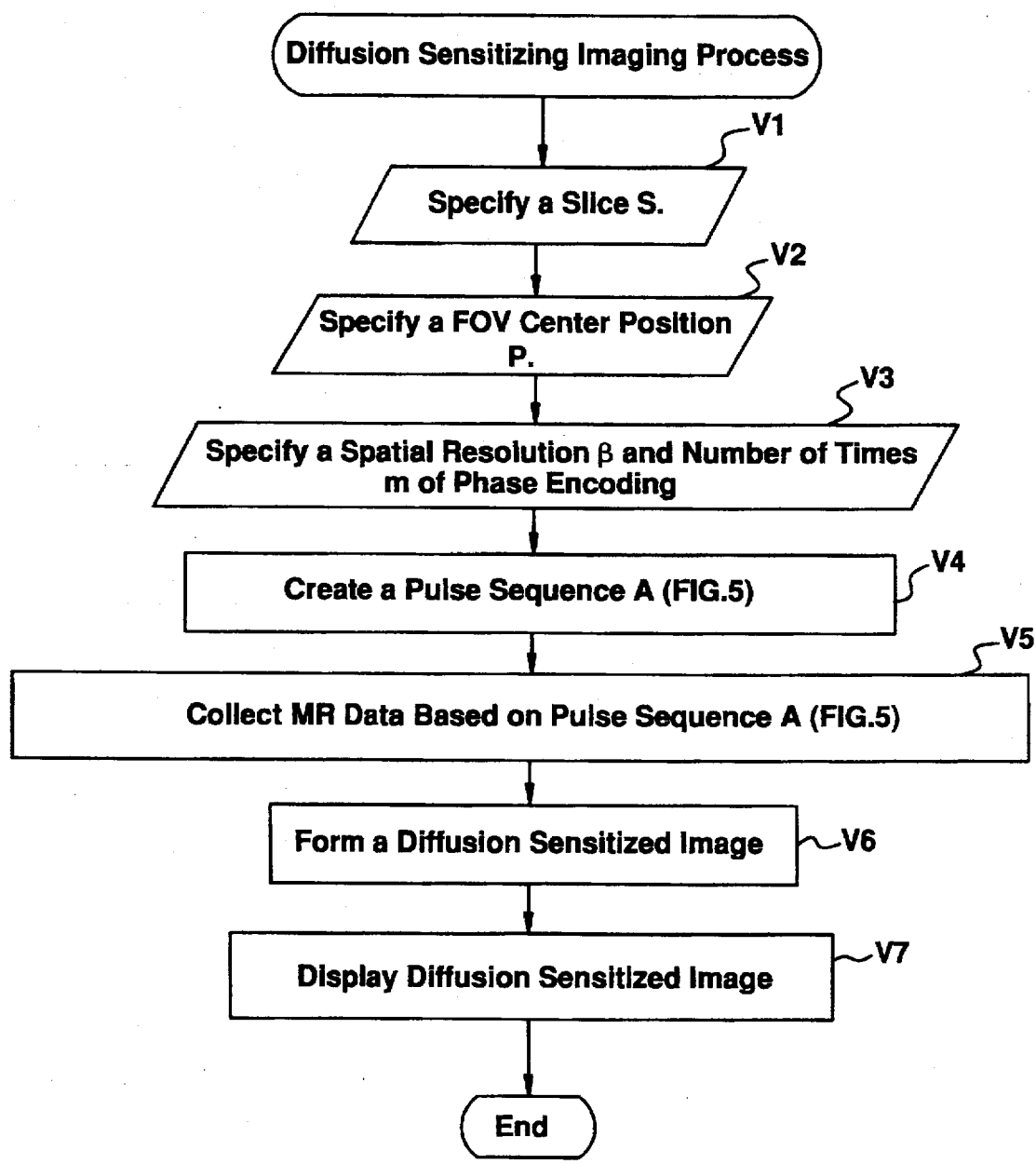
FIG. 2 is a flowchart of the diffusion sensitizing imaging process carried out by the MRI apparatus of the first embodiment.

FIG. 2 is the flowchart of the diffusion sensitizing imaging process carried out by the MRI apparatus 100.

Figure 3:
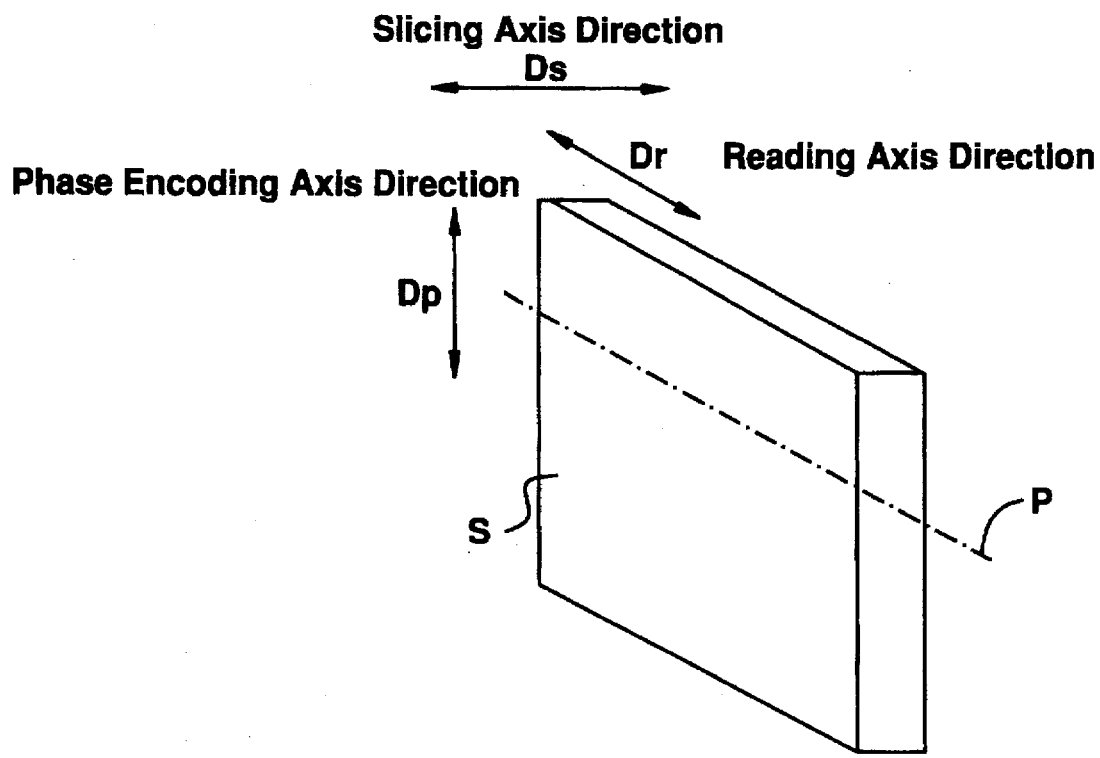
FIG. 3 is an explanatory diagram for a slice and the FOV center.

In step V1, the operator specifies a slice. Specifically, the operator enters the position and width of an intended exciting region S in the slicing axis direction Ds. As shown in FIG. 3, the lateral direction and longitudinal direction are set to be the reading axis direction Dr and phase encoding axis direction Dp, respectively.

In step V2, the operator specifies a center position P of FOV in the phase encoding axis direction Dp as shown in Pig. 3.

Figure 4:
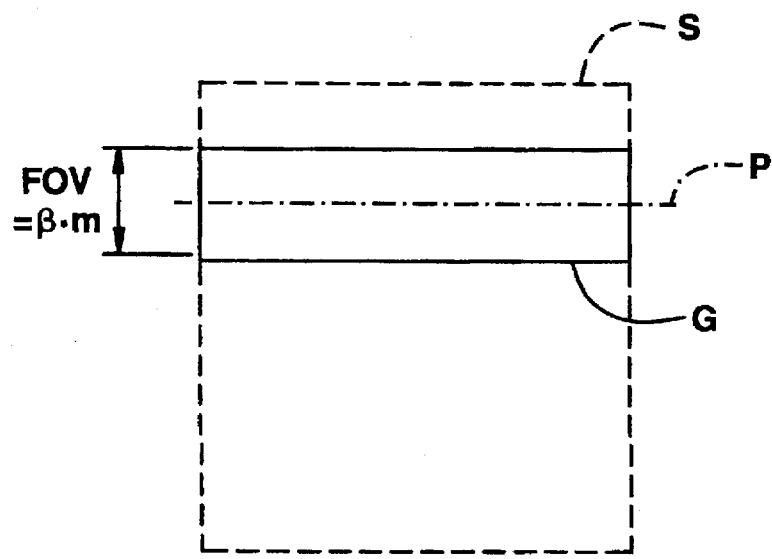
FIG. 4 is an explanatory diagram for a narrow FOV.

In step V3, the operator specifies a spatial resolution β in the phase encoding axis direction Dp and a number of times m of phase encoding of the diffusion sensitized image. For example, the β is set to be 1 mm, and the m is set to be 32. In this example, the FOV in the phase encoding axis direction Dp of the diffusion sensitized image G is evaluated to be 32 mm (=β·m=1·32) as shown in FIG. 4.

The process of step V4 creates a pulse sequence A of the echo planar imaging (EPI) method, with the IVIM method being applied.

Figure 5:
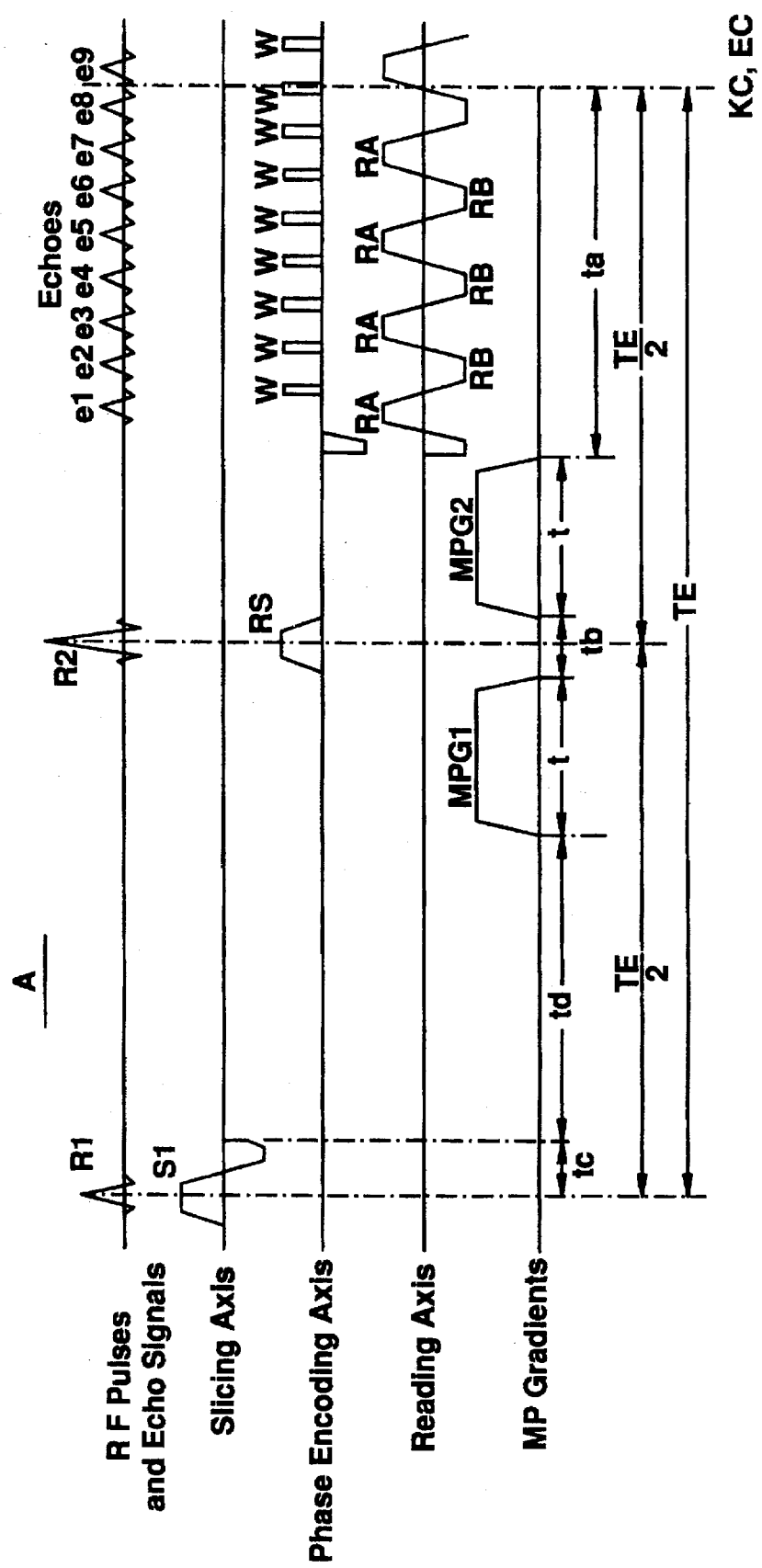
FIG. 5 is a timing chart showing an example of the pulse sequence used in the inventive diffusion sensitizing imaging method.

FIG. 5 shows the pulse sequence A of the EPI method.

In this pulse sequence A, an exciting pulse R1 and a slicing gradient S1 for the excitation of the slice S are applied. Subsequently, a diffusion sensitizing gradient MPG1 is applied. Next, a reversing pulse R2 and FOV limiting gradient RS for limiting the data collecting region to a narrow FOV (refer to FIG. 4) are applied. The FOV center position P is determined from the transmission frequency of the reversing pulse R2 and the FOV limiting gradient RS. Next, a diffusion sensitizing gradient MPG2 is applied. Next, a positive and negative reading gradients RA and RB are applied m times alternately and cyclically. Phase encoding gradients W are applied and, at the same time, MR data is collected from the multiple imaged echoes el~em. The amplitude-time product of the phase encoding gradient W is set to be $1/(\gamma \cdot FOV)$, where $\gamma$ is the magnetogyric ratio. In order to reduce the image pickup time, the half Fourier transformation is adopted and over-sampling of eight encoding steps or more is implemented.

In the pulse sequence A of FIG. 5, for a time interval of TE/2 (e.g.,70 ms) from the exciting pulse R1 to the reversing pulse R2, the time interval from the exciting pulse R1 to the spin echo center EC is TE (e.g.,140 ms). For an over-sampling time of ta (e.g.,25 ms), the time interval from the exciting pulse R1 to the commencement of application of the reading gradients RA and RB is TE-ta (e.g.,115 ms) in order for the coincidence of the spin echo center EC and k-space center KC. For a duration of the FOV limiting gradient RS of tb (e.g., 10 ms), the upper limit of the diffusion sensitizing gradients MPG1 and MPG2 is TE/2-ta-tb/2 (e.g.,40 ms). For a duration of the exciting pulse R1 and slicing gradient S1 of tc (e.g.,5 ms), the idle time td which precedes the diffusion sensitizing gradient MPG1 is TE/2-tb/2-t-tc (e.g., 20 ms).

Figure 6:
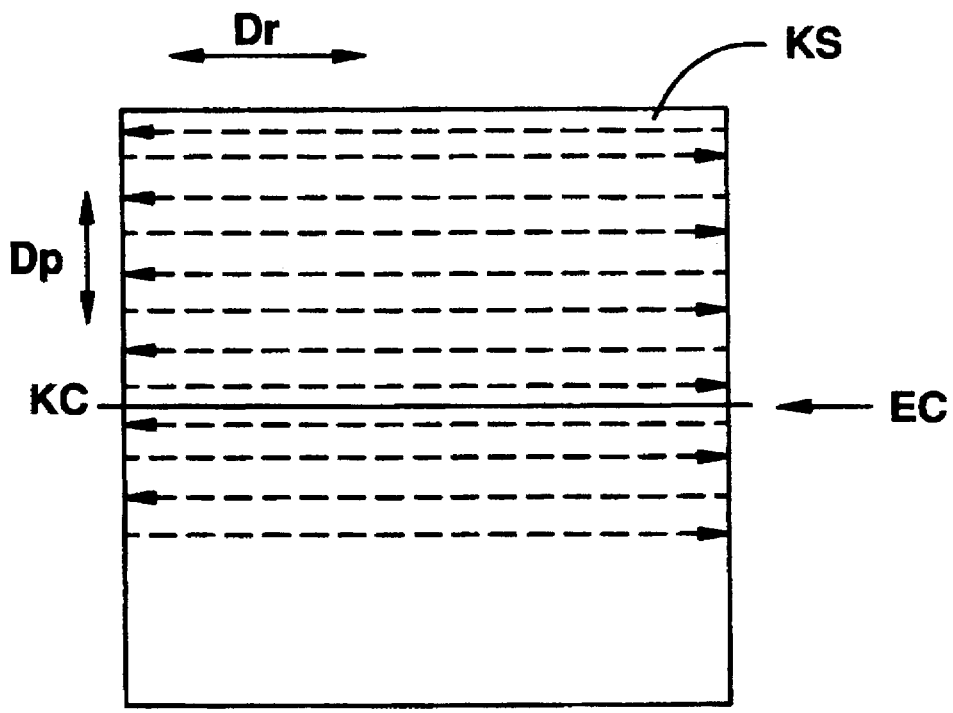
FIG. 6 is a diagram of the data collection trajectory in the k-space based on the pulse sequence shown in FIG. 5.

Returning to FIG. 2, the process of step V5 collects MR data for a half of the k-space KS and over-sampling portion based on the pulse sequence A, as shown in FIG. 6.

Figure 7:
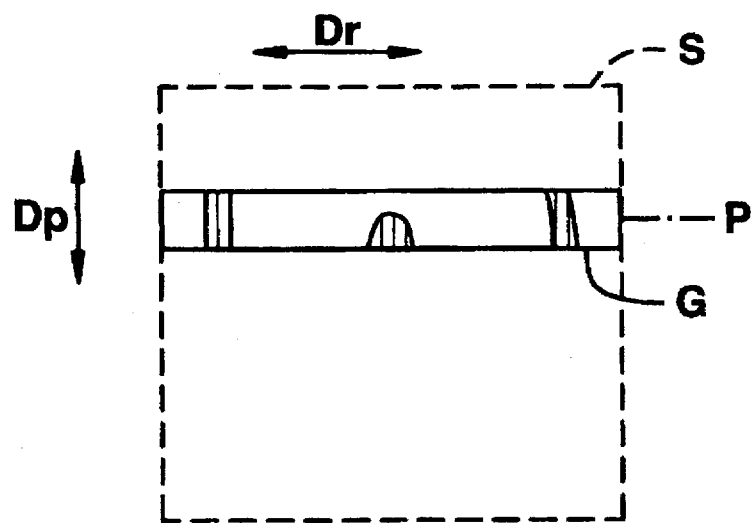
FIG. 7 is a diagram showing an example of diffusion sensitized images with a narrow FOV.

The process of step V6 implements the two-dimensional Fourier transformation for the MR data of the k-space KS thereby to form a diffusion sensitized image G as shown in FIG. 7.

Step V7 displays the produced diffusion sensitized image G.

Accordingly, the image pickup time for obtaining the diffusion sensitized image G from the MR data collected by a single excitation can be reduced from several tens seconds to several seconds, and motion artifacts can be alleviated. Although this diffusion sensitized image G has a narrow FOV in the phase encoding axis direction Dp, it has a practically sufficient resolution.

EMBODIMENT 2

Figure 8:
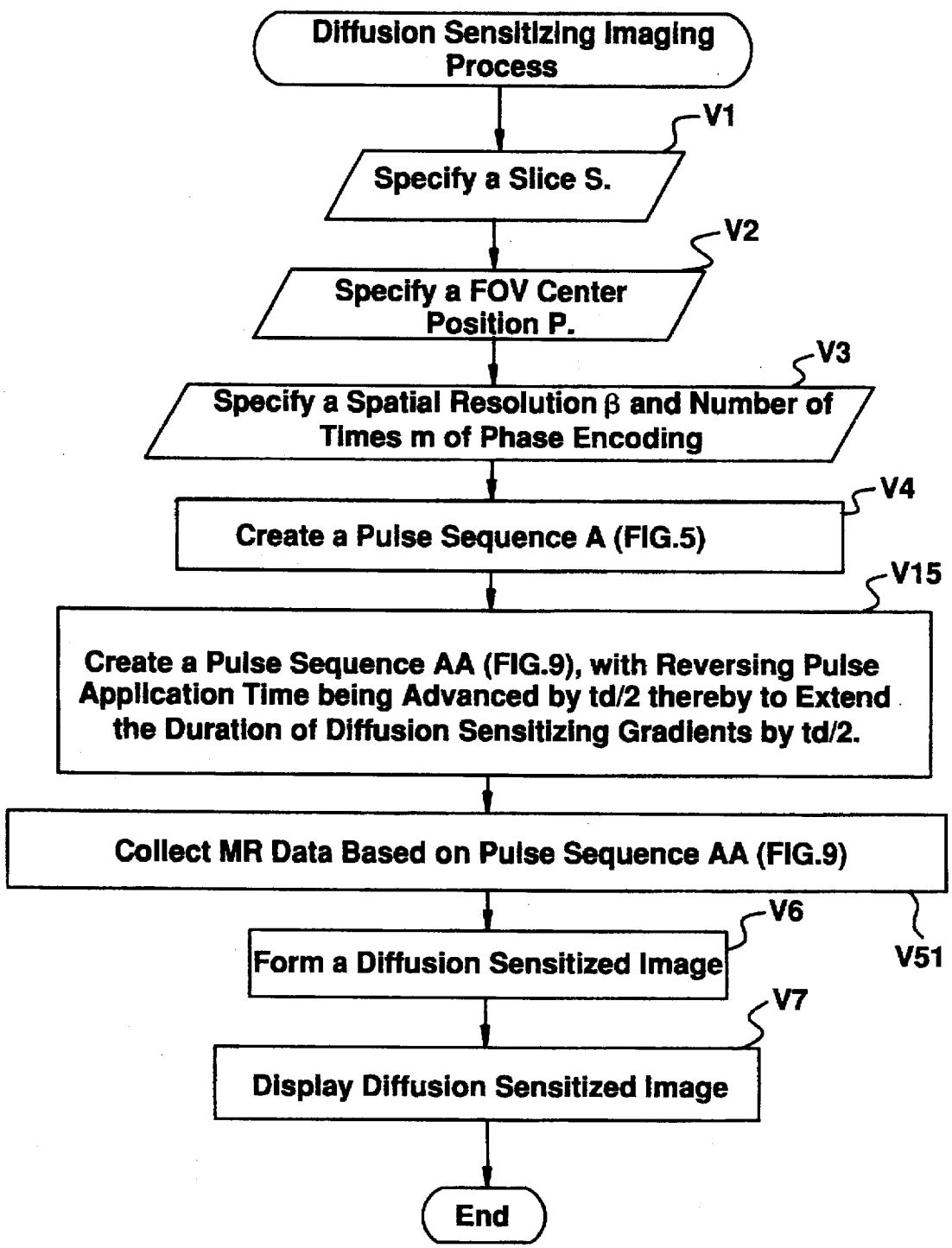
FIG. 8 is a flowchart of the diffusion sensitizing imaging process carried out by the MRI apparatus based on a second embodiment of this invention.

The MRI apparatus of the second embodiment shares the same block diagram of FIG. 1 with the first embodiment. FIG. 8 is a flowchart of the diffusion sensitizing imaging process carried out by the MRI apparatus of this embodiment.

In step V1, the operator specifies a slice S.

In step V2, the operator specifies a FOV center position P.

In step V3, the operator specifies a spatial resolution β and a number of times m of phase encoding, e.g., β is 1 mm and m is 32.

The process of step V4 creates a pulse sequence A.

Figure 9:
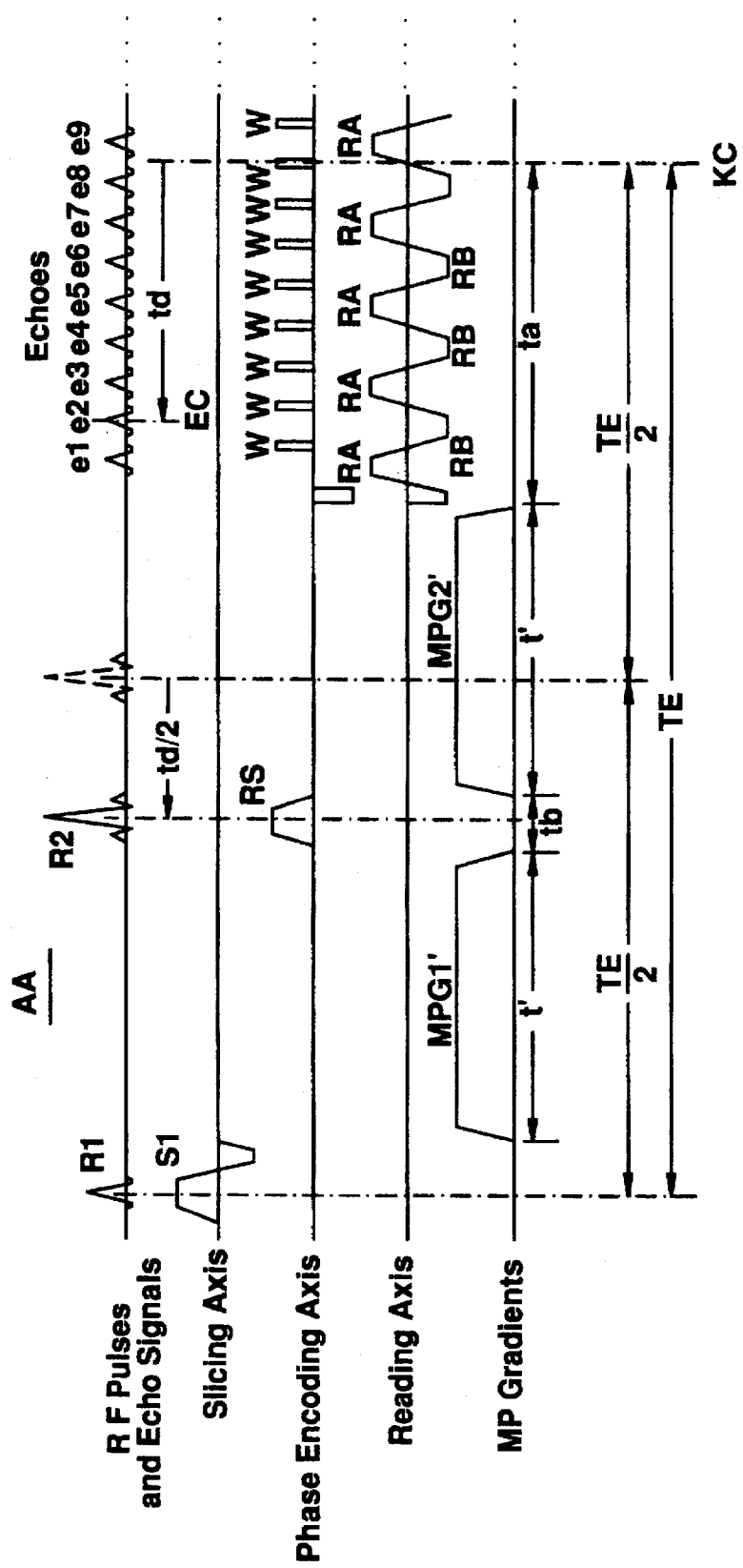
FIG. 9 is a timing chart showing another example of the pulse sequence used in the inventive diffusion sensitizing imaging method.

The process of step V15 evaluates the idle time td (e.g.,20 ms) of the pulse sequence A, and advances the application time point of the reversing pulse R2 by td/2 (e.g.,10 ms) and reforms the pulse sequence A to have the duration of the diffusion sensitizing gradients MPG1 and MPG2 each extended by td/2 (e.g.,10 ms) from the original t (e.g.,40 ms), as shown by AA in FIG. 9.

This pulse sequence AA has diffusion sensitizing gradients MPG1' and MPG2' each having a duration t' of t+td/2 (e.g.,50 ms) that is about 25% longer than the original pulse sequence A. The echo center EC is advanced by td (e.g.,20 ms) from the k-space center KC.

Figure 10:
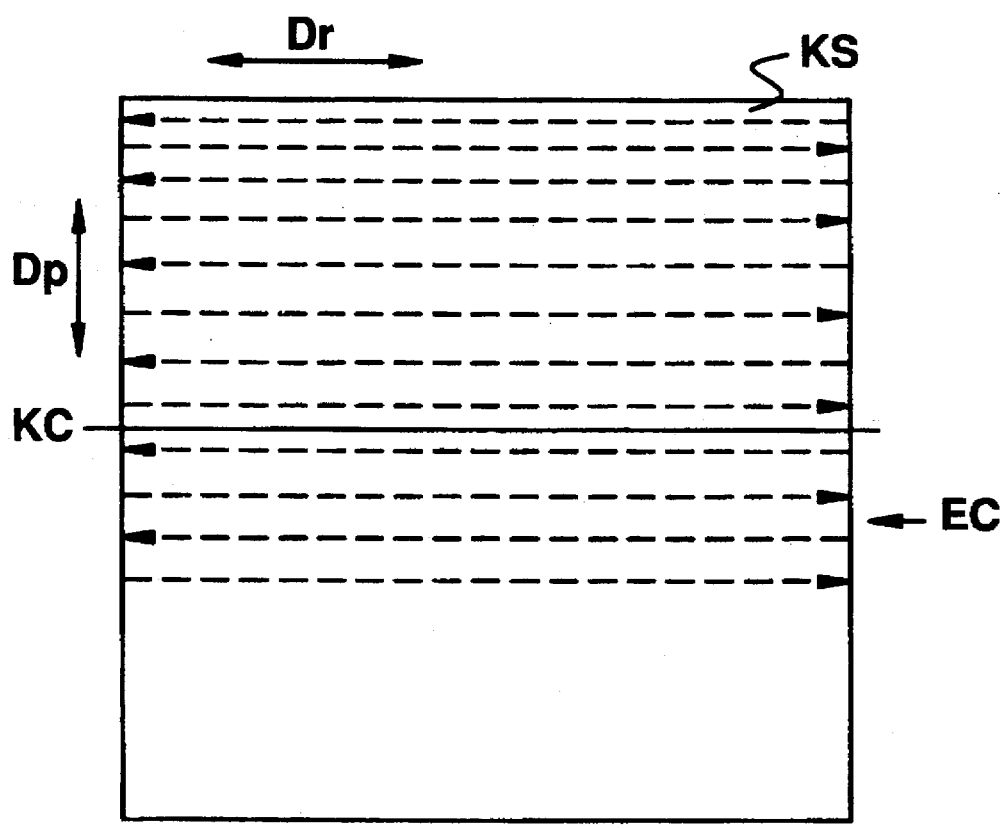
FIG. 10 is a diagram of the data collection trajectory in the k-space based on the pulse sequence shown in FIG. 9.

Returning to FIG. 8, the process of step V51 collects MR data in the pulse sequence AA for a half of the k-space KS and over-sampling portion as shown in FIG. 10. The process of step V6 implements the two-dimensional Fourier transformation for the MR data of the k-space KS thereby to form a diffusion sensitized image G as shown in FIG. 7. Step V7 displays the produced diffusion sensitized image G.

Accordingly, the image pickup time for obtaining the diffusion sensitized image G from the MR data collected by a single excitation can be reduced from several tens seconds to several seconds, and motion artifacts can be alleviated. Although this diffusion sensitized image G has a narrow FOV in the phase encoding axis direction Dp, it has a practically sufficient resolution. Furthermore, the duration of the diffusion sensitizing gradients MPG1' and MPG2' can be extended without increasing the number of times of image pickup, and the diffusion sensitization can be enhanced. Since the k-space center KC and spin echo center EC do not coincide, the degradation of image quantity does not impose a practical problem.

EMBODIMENT 3

The MRI apparatus of the third embodiment shares the same block diagram of FIG. 1 with the first embodiment.

Figure 11:
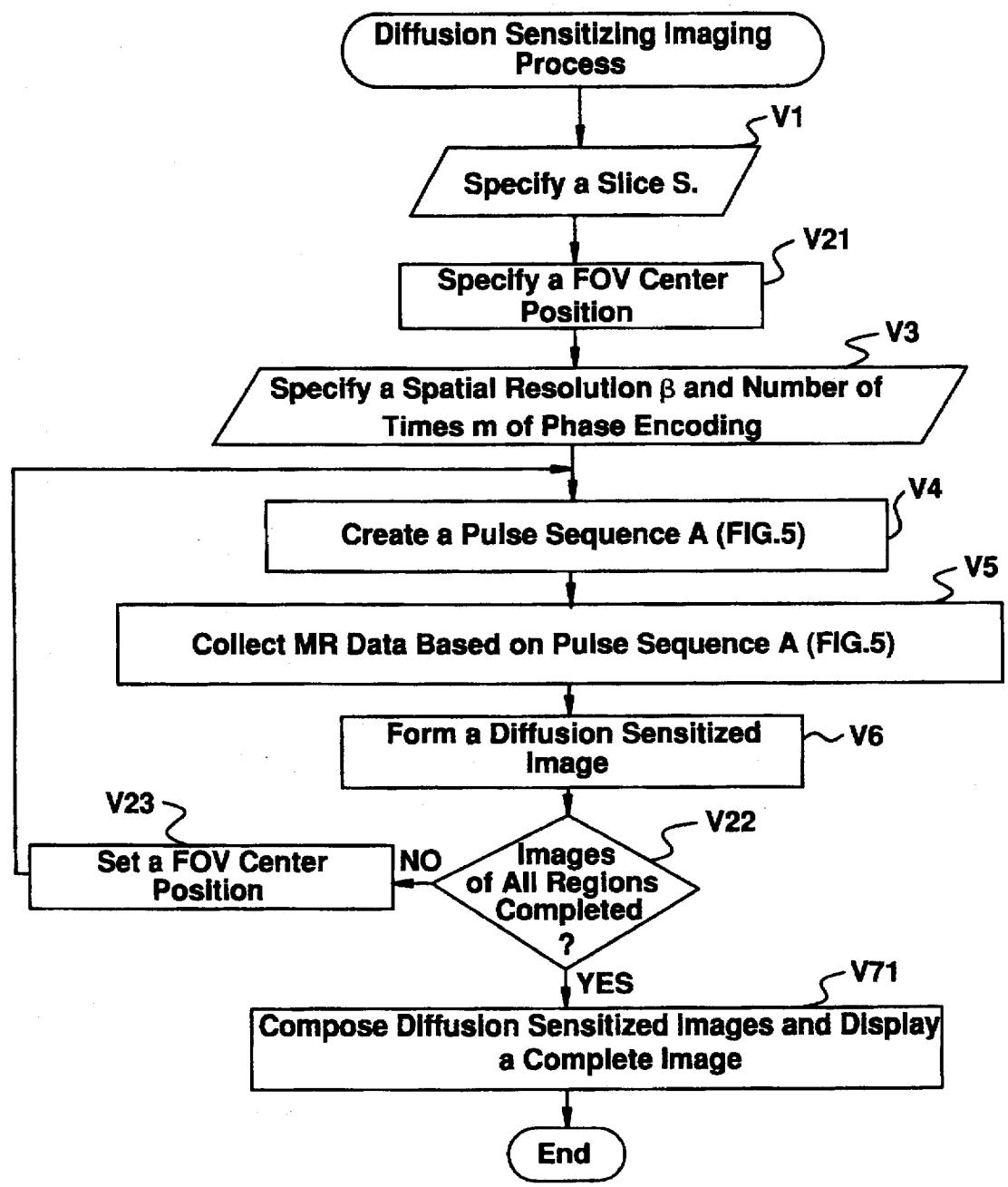
FIG. 11 is a flowchart of the diffusion sensitizing imaging process carried out by the MRI apparatus based on a third embodiment of this invention.

FIG. 11 is a flowchart of the diffusion sensitizing imaging process carried out by the MRI apparatus of this embodiment.

In step V1, the operator specifies a slice S.

The process of step V21 designates the FOV center position P for the initial position.

In step V3, the operator specifies a spatial resolution β and a number of times m of phase encoding, e.g., β is 1 mm and m is 32.

The process of step V4 creates a pulse sequence A.

The process of step V5 collects MR data based on the pulse sequence A.

The process of step V6 implements the two-dimensional Fourier transformation for the MR data of the k-space KS thereby to form a diffusion sensitized image G1.

Figure 12:
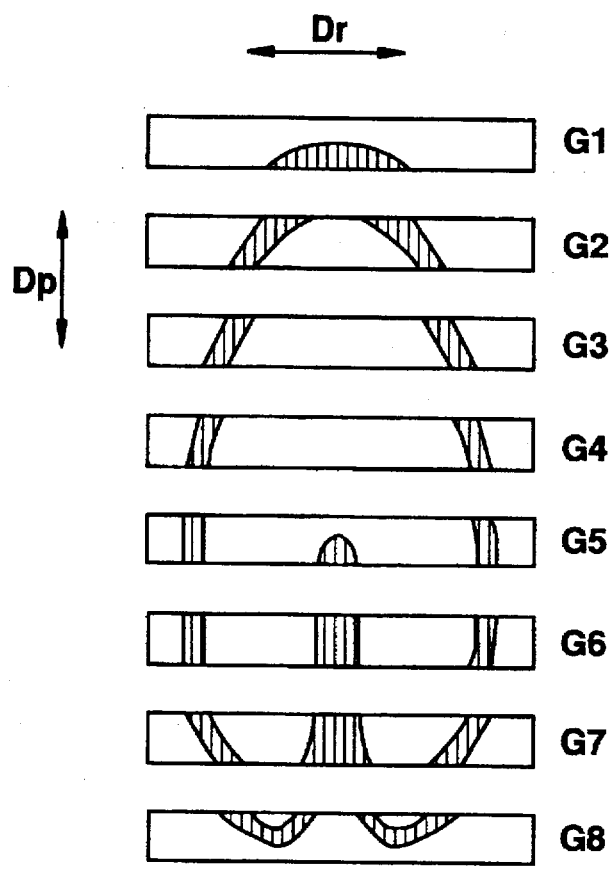
FIG. 12 is an explanatory diagram showing the composition of diffusion sensitized images, with their FOV center positions shifted.
Figure 13:
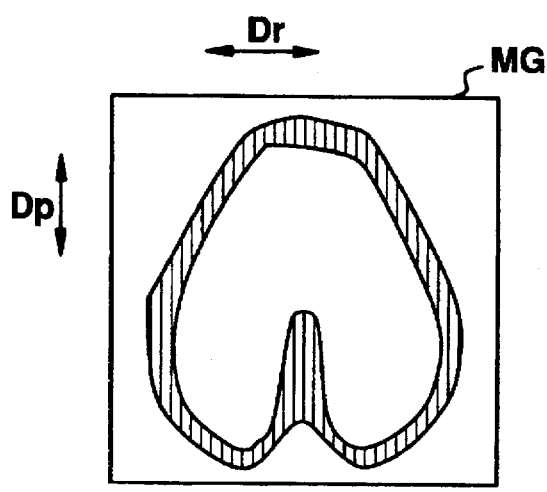
FIG. 13 is a diagram showing an example of diffusion sensitized images having a wide FOV resulting from the composition of multiple diffusion sensitized images, with their FOV center positions shifted.

The process of steps V22 and V23 repeat the steps V4 through V6, while moving the FOV center position P by the value of FOV in each cycle, thereby to create diffusion sensitized images G2~Gh. FIG. 12 shows the resulting diffusion sensitized images G1~Gh. The FOV center position P can be moved by varying the transmission frequency of the reversing pulse R2 and/or varying the FOV limiting gradient RS.

The process of step V71 composes the diffusion sensitized images G1~Gh to complete a diffusion sensitized image MG of a wide FOV, and displays it on the screen.

Consequently, a diffusion sensitized image having the same FOV as the conventional one and a practical resolution without motion artifacts can be obtained.

Although the foregoing embodiment has been explained for the case of collecting MR data based on the pulse sequence A of FIG. 5, the pulse sequence AA of FIG. 9 may be used instead.

EMBODIMENT 4

Figure 14:
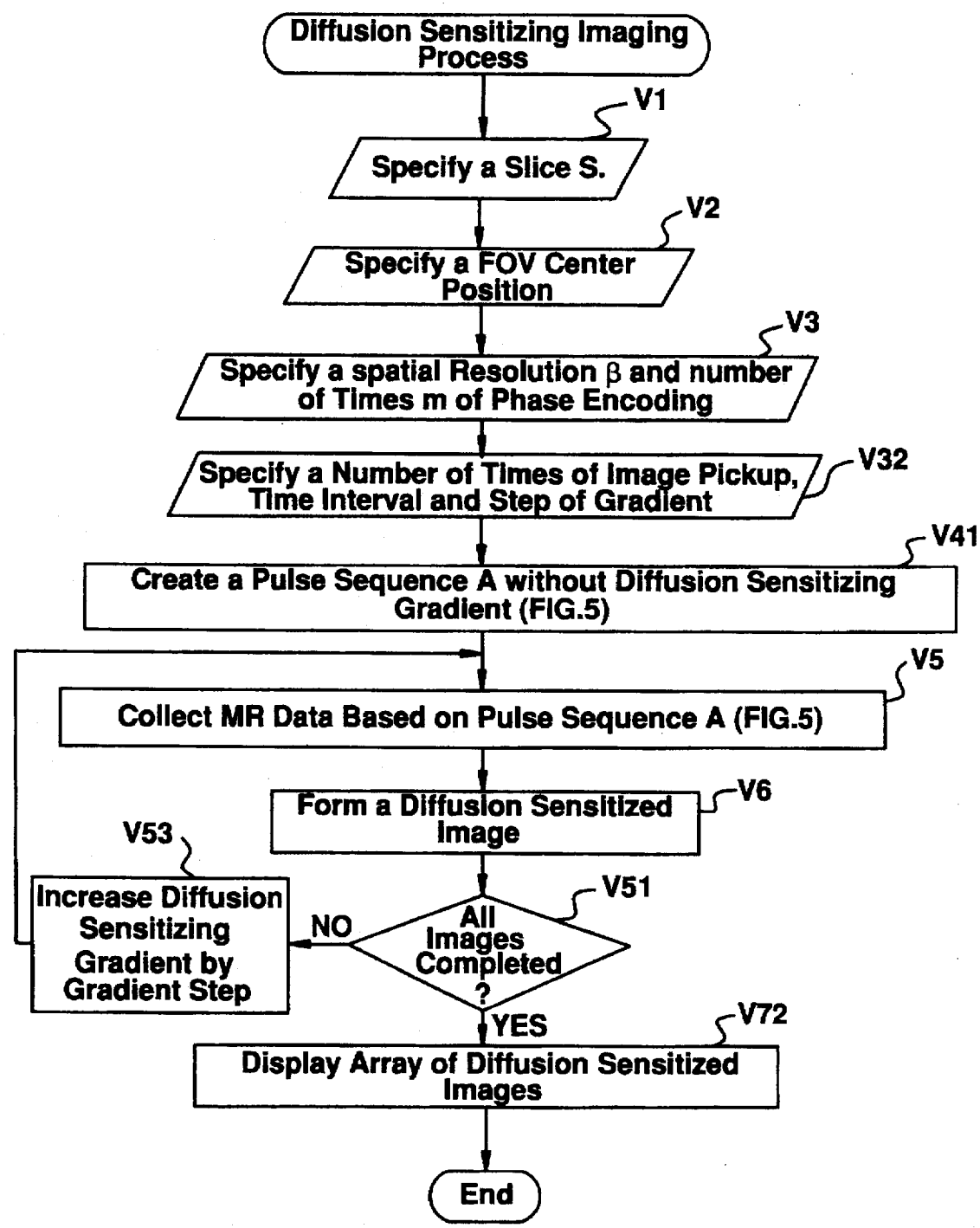
FIG. 14 is a flowchart of the diffusion sensitizing imaging process carried out by the MRI apparatus based on a fourth embodiment of this invention.

The MRI apparatus of the fourth embodiment shares the same block diagram of FIG. 1 with the first embodiment. FIG. 14 is a flowchart of the diffusion sensitizing imaging process carried out by the MRI apparatus of this embodiment.

In step V1, the operator specifies a slice S.

In step V2, the operator specifies a FOV center position P.

In step V3, the operator specifies a spatial resolution β and a number of times m of phase encoding, e.g., β is 1 mm and m is 32. In step V31, the operator specifies a number of times n of image pickup, a time interval of image pickup and a step of gradient of diffusion sensitizing gradient.

The process of step V41 creates a pulse sequence A of the EPI method, with the IVIM method being applied. The diffusion sensitizing gradients MPG1 and MPG2 have an initial value of "0".

The process of step V5 collects MR data based on the pulse sequence A.

The process of step V6 implements the two-dimensional Fourier transformation for the MR data of the k-space KS thereby to form a diffusion sensitized image G0. Because of the "0" initialize value of the diffusion sensitizing gradients MPG1 and MPG2, the image G0 is not actually diffusion-sensitized.

The process of steps V51 and V53 repeats the steps V5 and V6 for the specified number of times n at the specified time interval, while incrementing the diffusion sensitizing gradients MPG1 and MPG2 by the specified gradient step in each cycle, thereby to form diffusion sensitized images G2~Gn.

Step V7 displays an array of the produced diffusion sensitized images G1~Gn.

Figure 15:
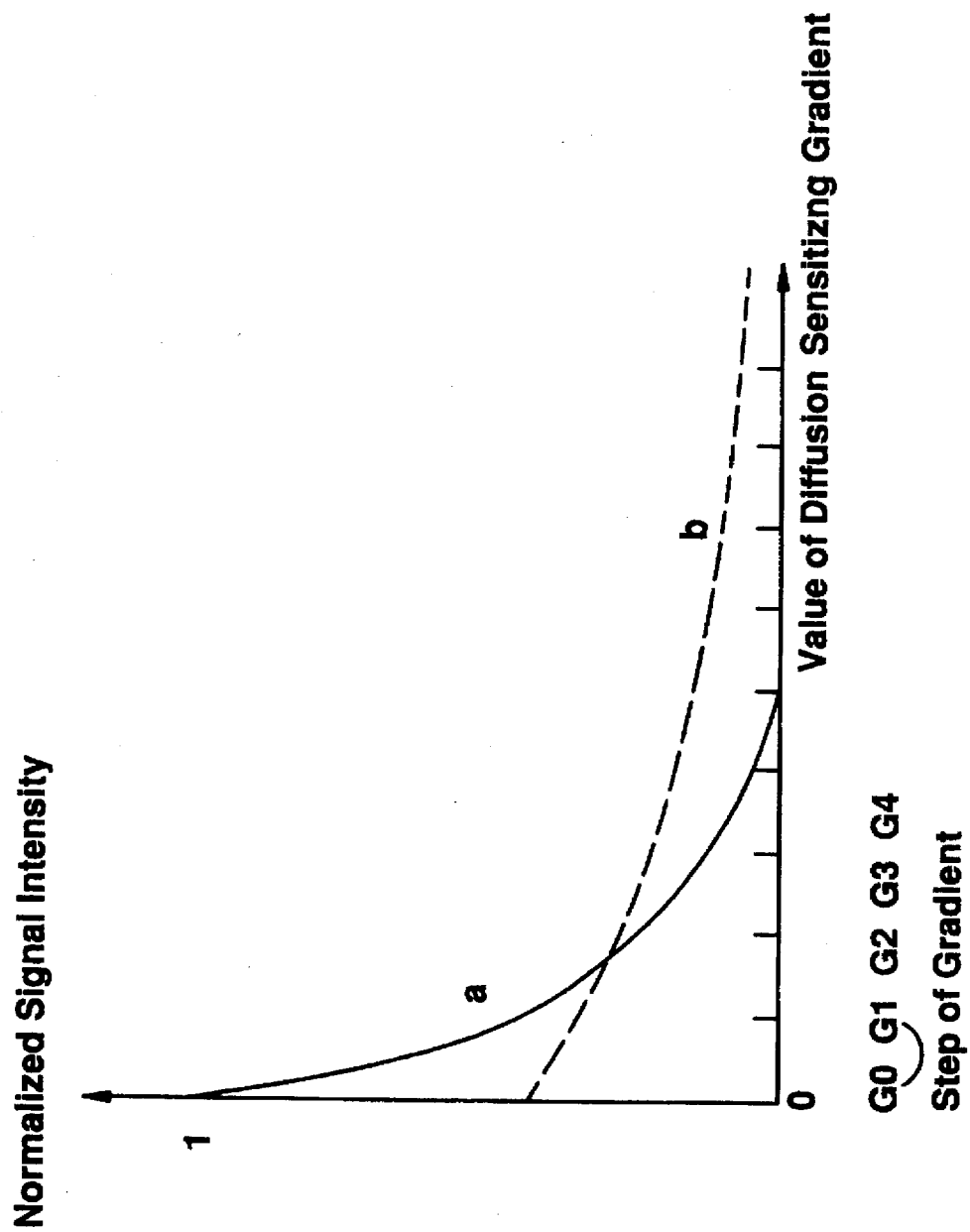
FIG. 15 is an explanatory diagram for a true diffusion and an apparent diffusion.

In FIG. 15, indicated by "a" is an apparent diffusion caused by the blood flow in capillaries for example. The signal intensity is high for smaller diffusion sensitizing gradients MPG1 and MPG2, whereas it is significantly low for larger MPG1 and MPG2. Shown by (b) in FIG. 15 is a true diffusion resulting from water in cells of the body, and the signal intensity is low for smaller diffusion sensitizing gradients MPG1 and MPG2 and it does not fall much with the increase of the MPG1 and MPG2.

Accordingly, by comparing the arrayed diffusion sensitized images, it becomes possible to distinguish a true diffusion from an apparent diffusion.

Although the foregoing embodiment has been explained for the case of collecting MR data based on the pulse sequence A of FIG. 5, the pulse sequence AA of FIG. 9 may be used instead.

EMBODIMENT 5

The MRI apparatus of the fifth embodiment shares the same block diagram of FIG. 1 with the first embodiment.

Figure 16:
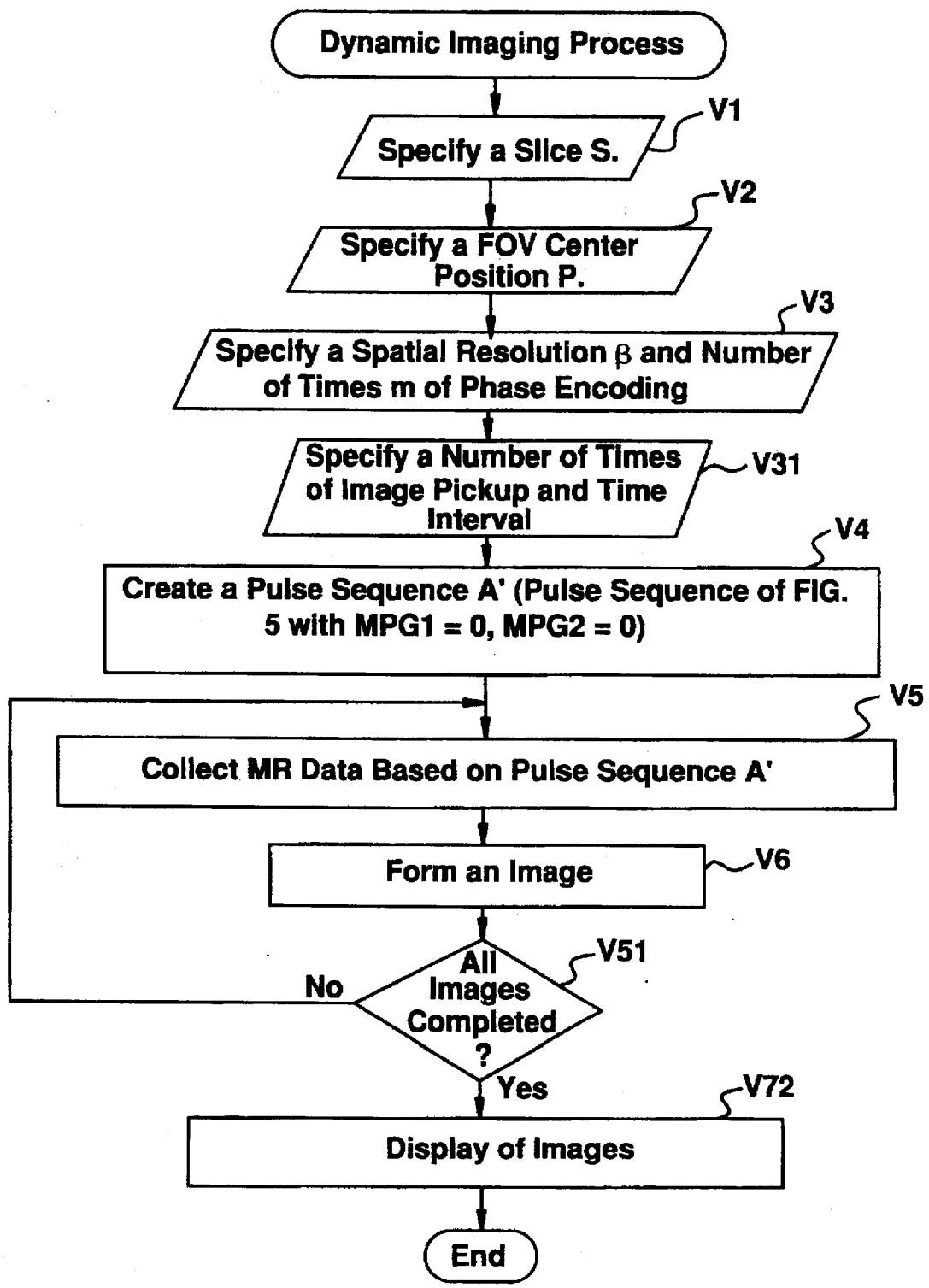
FIG. 16 is a flowchart of the diffusion sensitizing imaging process carried out by the MRI apparatus based on a fifth embodiment of this invention.
Figure 17:
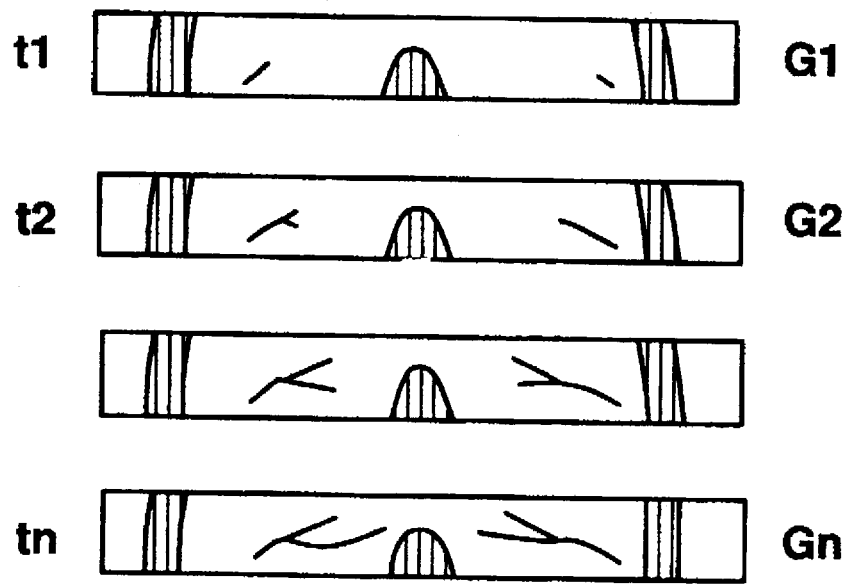
FIG. 17 is an explanatory diagram for the screen on which images of different image pickup time points are displayed by being arrayed.
Figure 18:
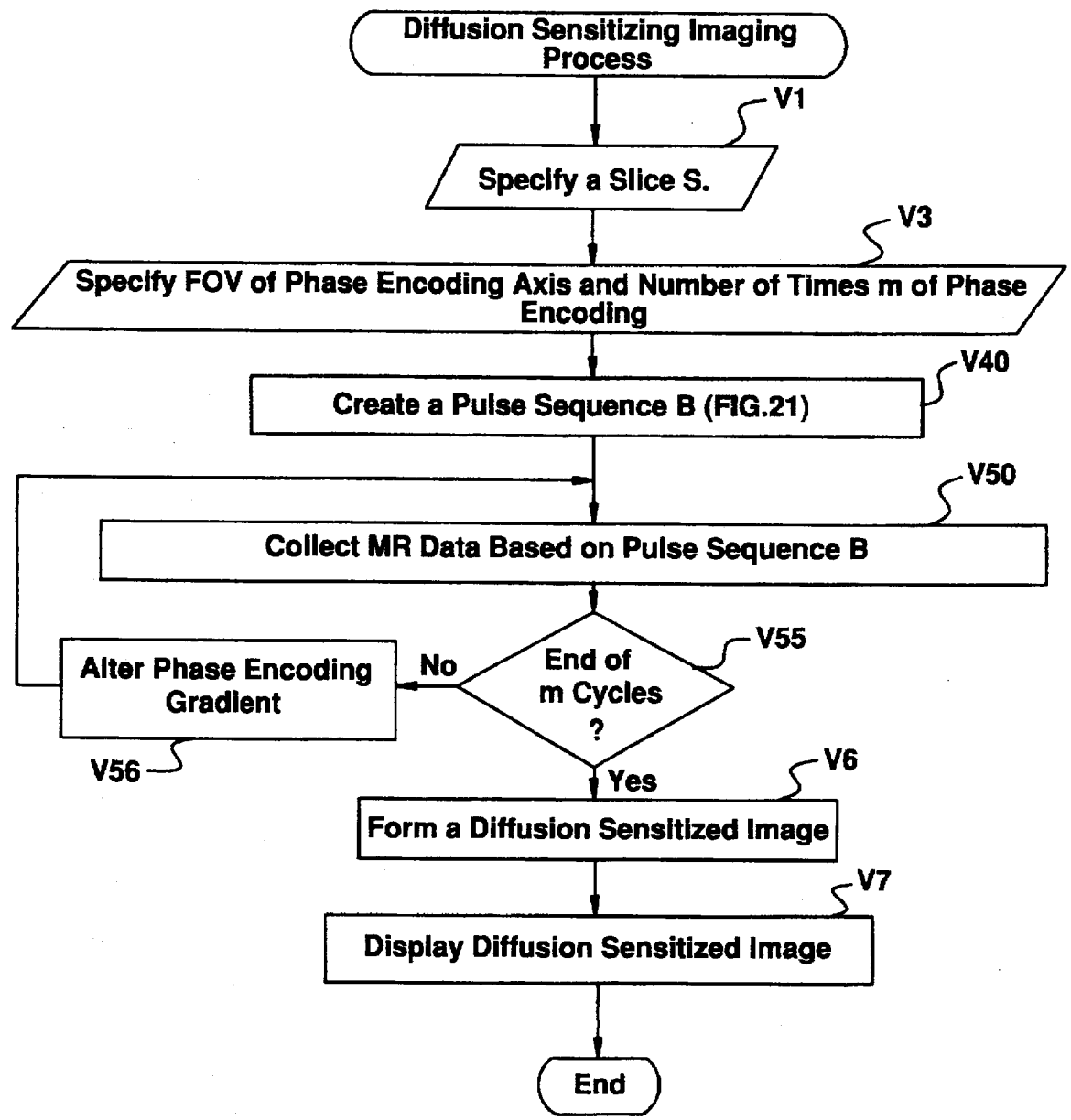
FIG. 18 is a flowchart of the diffusion sensitizing imaging process carried out by the conventional MRI apparatus.
Figure 19:
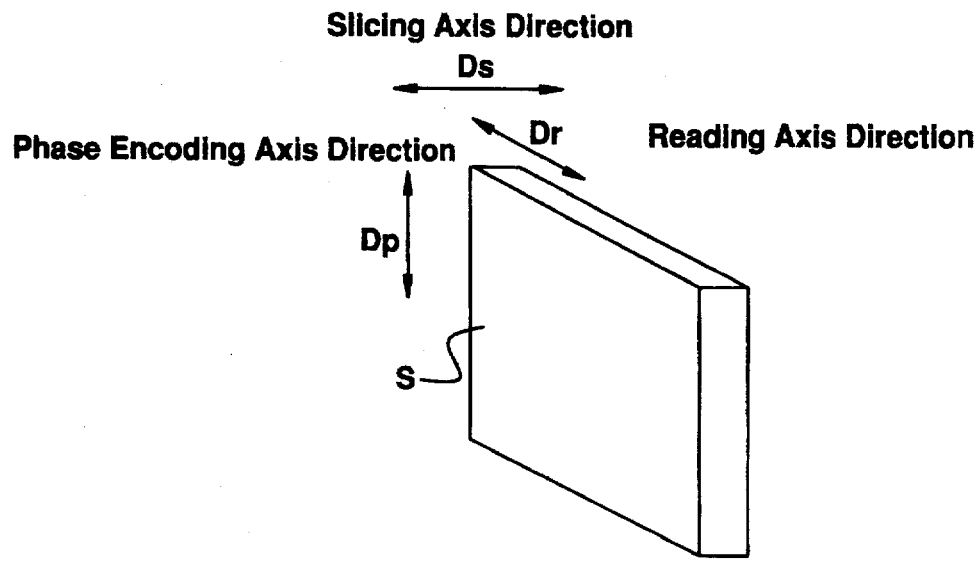
FIG. 19 is an explanatory diagram for a slice.
Figure 20:
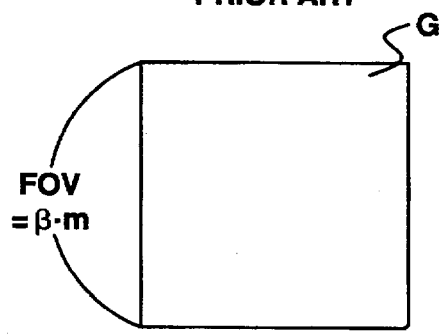
FIG. 20 is an explanatory diagram for a wide FOV.
Figure 21:
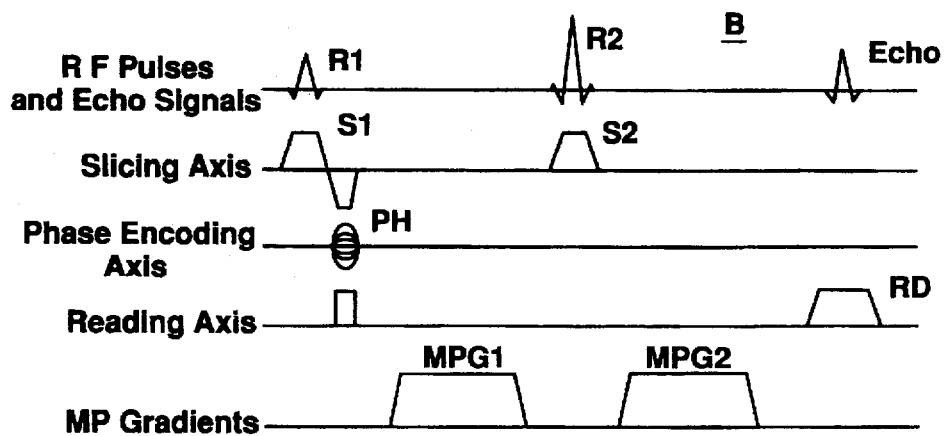
FIG. 21 is a timing chart showing an example of the pulse sequence used in the conventional diffusion sensitizing imaging method.
Figure 22:
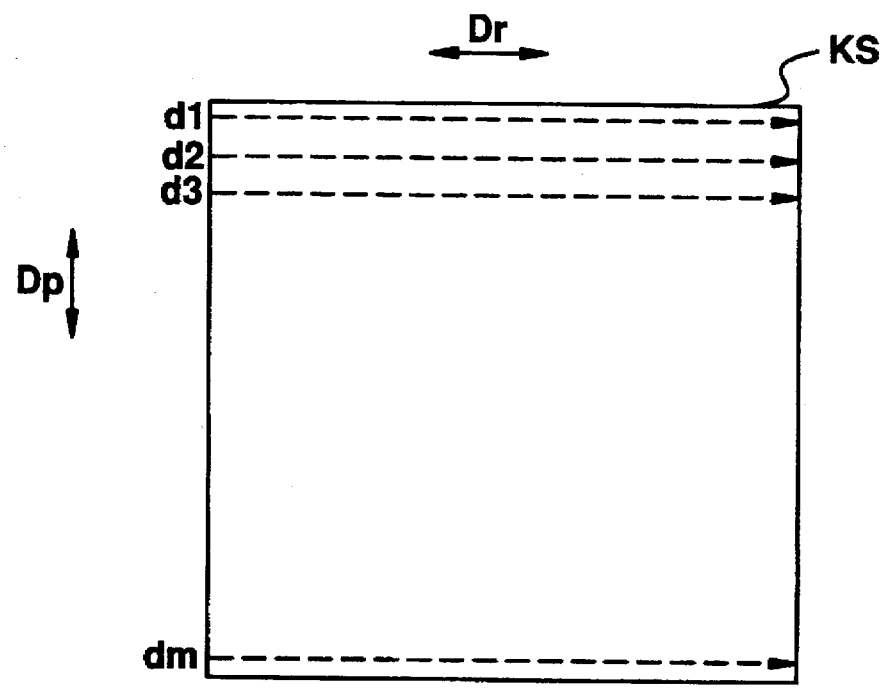
FIG. 22 is a diagram of the data collection trajectory in the k-space based on the conventional method.
Figure 23:
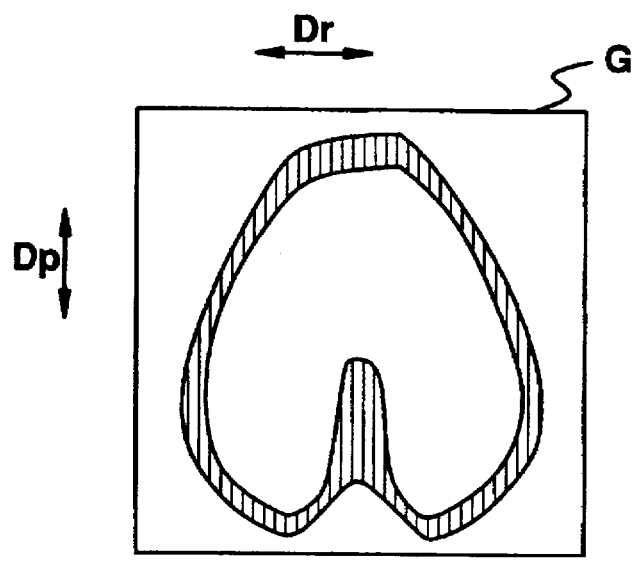
FIG. 23 is a diagram showing an example of diffusion sensitized images having a wide FOV.

FIG. 16 is a flowchart of the dynamic imaging process carried out by the MRI apparatus of this embodiment.

In step V1, the operator specifies a slice S.

In step V2, the operator specifies an FOV center position P.

In step V3, the operator specifies a spatial resolution β and a number of times m of phase encoding, e.g., β is 1 mm and m is 32.

In step V31, the operator specifies a number of times n of image pickup and a time interval of image pickup.

The process of step V4 creates a pulse sequence A' of the EPI method, which is the pulse sequence A of FIG. 5 for MPG1=0 and MPG2=0 (or the pulse sequence AA of FIG. 9 for MPG1'=0 and MPG2'=0).

The process of step V5 collects MR data based on the pulse sequence A'.

The process of step V6 implements the two-dimensional Fourier transformation for the MR data of the k-space KS thereby to form an image G1 of a first time-phase.

The process of step V51 repeats the steps V5 and V6 at time points t2 through tn at the specified time interval thereby to form images G2–Gn of a second through n-th time-phases.

Step V72 displays an array of the produced images G1–Gn.

Consequently, the apparatus produces images having a practical spatial resolution, although the FOV is narrow, continuously at a high time resolution, allowing the inspector to observe the time-to-time change of the body. For example, with contrast medium being injected into a body under test, the time-to-time change of the body can be observed.

According to the diffusion sensitizing imaging method and MRI apparatus based on this invention, it is possible to obtain diffusion sensitized images at a practical spatial resolution, with artifacts attributable to the body movement being alleviated in exchange for a narrow FOV in the phase encoding axis direction. The method and apparatus are also capable of producing diffusion sensitized images of the same FOV as the conventional one without motion artifacts at a practical spatial resolution. The method and apparatus enables the inspector to distinguish a true diffusion from an apparent diffusion, and are capable of producing highly diffusion-sensitized images.

According to the dynamic imaging method and MRI apparatus based on this invention, it is possible to obtain images continuously at a practical spatial resolution and high time resolution in exchange for a narrow FOV in the phase encoding axis direction.

What is claimed is:

1. A diffusion sensitizing imaging method comprising the steps of:
   applying a slicing gradient which limits the exciting region in the slicing axis direction together with an exciting pulse;
   applying a diffusion sensitizing gradient;
   applying an FOV limiting gradient which limits the data collecting region in the phase encoding axis direction together with a reversing pulse;
   applying a diffusion sensitizing gradient;
   reversing the gradient magnetic field continuously to image multiple echoes and collecting MR data from the resulting echoes; and
   producing a diffusion sensitized image of the data collecting region from the collected MR data.

2. A diffusion sensitizing imaging method comprising the steps of:
   applying a slicing gradient which limits the exciting region in the slicing axis direction together with an exciting pulse;
   applying a diffusion sensitizing gradient;
   applying an FOV limiting gradient which limits the data collecting region in the phase encoding axis direction together with a reversing pulse;
   applying another diffusion sensitizing gradient;
   applying alternate positive and negative gradient magnetic field pulses continuously to image multiple echoes and collecting MR data from the resulting echoes; and
   producing a diffusion sensitized image of the data collecting region from the collected MR data, wherein
   the timing of the alternative posite and negative gradient magnetic field pulses are adjusted such that the resulting point in k-space corresponding to a spin echo center precedes the actual k-space center so that the resulting time interval from the time of application of the negative gradient magnetic field pulse to the time of commencement of application of the positive gradient magnetic field pulse is longer than the case of a resulting coincident point in k-space corresponding to the spin echo center and the actual k-space center, thereby extending the duration of the diffusion sensitizing gradients accordingly.

3. A method of dynamic imaging comprising the steps of:
   applying a slicing gradient which limits the exciting region in the slicing axis direction together with an exciting pulse;
   applying an FOV limiting gradient which limits the data collecting region in the phase encoding axis direction together with a reversing pulse; and
   applying and reversing a gradient magnetic field continuously to image multiple echoes and collecting MR data from the resulting echoes, wherein
   said foregoing steps are repeated at different times thereby to produce images of the same data collecting region from the MR data collected at the different times.

4. An MRI apparatus comprising:
   data collecting means which applies a slicing gradient which limits the exciting region in the slicing axis direction together with an exciting pulse, applies a diffusion sensitizing gradient, applies an FOV limiting gradient which limits the data collecting region in the phase encoding axis direction together with a reversing pulse, applies a diffusion sensitizing gradient, and reverses the gradient magnetic field continuously to image multiple echoes and collects MR data from the resulting echoes;
   image forming means which produces a diffusion sensitized image from the collected MR data; and
   image display means which displays the produced diffusion sensitized image.

5. An MRI apparatus according to claim 4, wherein said data collecting means implements the MR data collection set forth in claim 4 a multiple number of times, while moving the data collecting region in the phase encoding axis direction, and said image display means displays a diffusion sensitized image having an enlarged FOV resulting from the composition of the produced multiple diffusion sensitized images.

6. An MRI apparatus according to claim 4, wherein said data collecting means implements the MR data collection a multiple number of times for a fixed data collecting region, while altering the diffusion sensitizing gradients, and said image display means displays the produced multiple diffusion sensitized images.

7. An MRI apparatus comprising:
   data collecting means which applies a slicing gradient which limits the exciting region in the slicing axis direction together with an exciting pulse, applies a first diffusion sensitizing gradient, applies an FOV limiting gradient which limits the data collecting region in the phase encoding axis direction together with a reversing pulse, applies a second diffusion sensitizing gradient, and applies and reverses gradient magnetic fields continuously to image multiple echoes and collects MR data from the resulting echoes, with the timing of application of the reverse gradient magnetic field and the gradient magnetic field being adjusted such that the resulting point in k-space corresponding to a spin echo center precedes the actual k-space center so that the resulting time interval from the application of the reverse gradient magnetic field to the commencement of application of the gradient magnetic field is longer than the case of a resulting coincident point in k-space corresponding to the spin echo center and the actual k-space center, thereby extending the duration of the diffusion sensitizing gradients accordingly;

image forming means which produces a diffusion sensitized image from the collected MR data; and image display means which displays the produced diffusion sensitized image.

8. An MRI apparatus according to claim 7, wherein said data collecting means implements the MR data collection set forth in claim 5, a multiple number of times, while moving the data collecting region in the phase encoding axis direction, and said image display means displays a diffusion sensitized image having an enlarged FOV resulting from the composition of the produced multiple diffusion sensitized images.

9. An MRI apparatus according to claim 7, wherein said data collecting means implements the MR data collection a multple number of times for a fixed data collecting region, while altering the diffusion sensitizing gradients, and said image display means displays the produced multiple diffusion sensitized images.

10. An MRI apparatus comprising:

data collecting means which applies a slicing gradient which limits the exciting region in the slicing axis direction together with an exciting pulse, applies an FOV limiting gradient which limits the data collecting region in the phase encoding axis direction together with a reversing pulse, and reverses the gradient magnetic field continuously to image multiple echoes and collects MR data from the resulting echoes, with the foregoing operations being repeated for different time periods;

image forming means which produces images for the same data collecting region from MR data collected at different times; and image display means which displays the images obtained at the different time periods.

* * * * *